(12) United States Patent
Shinagawa et al.

(10) Patent No.: US 8,144,953 B2
(45) Date of Patent: Mar. 27, 2012

(54) MULTI-SCALE ANALYSIS OF SIGNAL ENHANCEMENT IN BREAST MRI

(75) Inventors: Yoshihisa Shinagawa, Downingtown, PA (US); Gerardo Hermosillo Valadez, West Chester, PA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 859 days.

(21) Appl. No.: 12/206,804

(22) Filed: Sep. 9, 2008

(65) Prior Publication Data
US 2009/0080741 A1 Mar. 26, 2009

Related U.S. Application Data

(60) Provisional application No. 60/971,433, filed on Sep. 11, 2007.

(51) Int. Cl.
*G06K 9/00* (2006.01)
(52) U.S. Cl. .................. 382/128; 382/130; 382/131
(58) Field of Classification Search ............. 382/128, 382/130, 131; 600/410, 420; 324/309, 306, 324/307
See application file for complete search history.

(56) References Cited

U.S. PATENT DOCUMENTS

| | | | |
|---|---|---|---|
| 7,734,078 B2 * | 6/2010 | Prince et al. | 382/130 |
| 7,761,136 B2 * | 7/2010 | Ohishi et al. | 600/425 |
| 2003/0053670 A1 | 3/2003 | Hauper et al. | |
| 2005/0119552 A1 | 6/2005 | Hochman | |
| 2009/0069669 A1 * | 3/2009 | Valadez et al. | 600/420 |
| 2009/0093711 A1 * | 4/2009 | Hermosillo Valadez | 600/420 |
| 2009/0238428 A1 * | 9/2009 | Shinagawa et al. | 382/131 |

OTHER PUBLICATIONS

Jacobs et al., "Benign and Malignant Breast Lesions: Diagnosis With Multiparametric MR Imaging", Radiology, Oak Brook, IL, vol. 229, Jan. 1, 2003, pp. 225-232.
Behrens et al., "Computer Assistance for MR based diagnosis of breast cancer: Present and future challenges", Computerized Medical Imaging and Graphcs, Pergamon Press, New York, NY, vol. 31, No. 4-5, Apr. 20, 2007, pp. 236-247.
Soltanian-Zadeh et al., "A Multidimensional Nonlinear Edge-Preserving Filter for Magnetic Resonance Image Restoration", IEEE Transactions on Image Processing, IEEE Service Center, Piscataway, NJ, vol. 4, No. 2, Feb. 1, 1995, pp. 147-161.
Yoo et al., "Postprocessng Techniques for Time-Resolved Contrast-Enhanced MR Angiography", Radiology, Oak Brook, IL, vol. 222, No. 2, Feb. 1, 2002, pp. 564-568.

(Continued)

*Primary Examiner* — Louis Arana
(74) *Attorney, Agent, or Firm* — Peter Robert Withstandley (57) ABSTRACT

A method for computer assisted lesion detection in magnetic resonance (MR) images includes acquiring dynamic contrast enhanced (DCE) MR images. The images are processed to produce a subtraction image illustrating change in voxel enhancement between the images. A Gaussian low-pass filter is applied to the subtraction image. An elimination mask is created from the filtered subtraction image by removing voxels with enhancement values below a threshold value. The elimination mask is used to remove noise from the subtraction image. One or more regions of suspicion are automatically detected from the noise-removed subtraction image. To produce the subtraction image, DCE-MR images are divided into first and second sub-sets. Positive-signed enhancement values of voxels of the MR images from the first sub-set are added to a combined subtraction image along with absolute values of all enhancement values of voxels of the MR images from the second sub-set.

12 Claims, 6 Drawing Sheets

OTHER PUBLICATIONS

Kump et al., "Digital subtraction peripheral angiography using image stacking: Initial clinical results", Medical Physics, AIP, Melville, NY, vol. 28, No. 7, Jul. 1, 2001, pp. 1482-1492.

International Search Report including Notification of Transmittal of the International Search Report, International Search Report, and Written Opinion of the International Searching Authority.

* cited by examiner

Category 1

Category 2

Category 3

MULTI-SCALE ANALYSIS OF SIGNAL ENHANCEMENT IN BREAST MRI

CROSS-REFERENCE TO RELATED APPLICATION

The present application is based on provisional application Ser. No. 60/971,433 filed Sep. 11, 2007, the entire contents of which are herein incorporated by reference.

BACKGROUND OF THE INVENTION

1. Technical Field

The present disclosure relates to breast MRI and, more specifically, to multi-scale analysis of signal enhancement in breast MRI.

2. Discussion of Related Art

Computer aided diagnosis (CAD) is the process of using computer vision systems to analyze medical image data and make a determination as to what regions of the image data are potentially problematic. Some CAD techniques then present these regions of suspicion to a medical professional such as a radiologist for manual review, while other CAD techniques make a preliminary determination as to the nature of the region of suspicion. For example, some CAD techniques may characterize each region of suspicion as a lesion or a non-lesion. The final results of the CAD system may then be used by the medical professional to aid in rendering a final diagnosis.

Because CAD techniques may identify lesions that may have been overlooked by a medical professional working without the aid of a CAD system, and because CAD systems can quickly direct the focus of a medical professional to the regions most likely to be of diagnostic interest, CAD systems may be highly effective in increasing the accuracy of a diagnosis and decreasing the time needed to render diagnosis. Accordingly, scarce medical resources may be used to benefit a greater number of patients with high efficiency and accuracy.

CAD techniques have been applied to the field of mammography, where low-dose x-rays are used to image a patient's breast to diagnose suspicious breast lesions. However, because mammography relies on x-ray imaging, mammography may expose a patient to potentially harmful ionizing radiation. As many patients are instructed to undergo mammography on a regular basis, the administered ionizing radiation may, over time, pose a risk to the patient. Moreover, it may be difficult to use x-rays to differentiate between different forms of masses that may be present in the patient's breast. For example, it may be difficult to distinguish between calcifications and malignant lesions.

Magnetic resonance imaging (MRI) is a medical imaging technique that uses a powerful magnetic field to image the internal structure and certain functionality of the human body. MRI is particularly suited for imaging soft tissue structures and is thus highly useful in the field of oncology for the detection of lesions.

In dynamic contrast enhanced MRI (DCE-MRI), many additional details pertaining to bodily soft tissue may be observed. These details may be used to further aid in diagnosis and treatment of detected lesions.

DCE-MRI may be performed by acquiring a sequence of MR images that span a time before magnetic contrast agents are introduced into the patient's body and a time after the magnetic contrast agents are introduced. For example, a first MR image may be acquired prior to the introduction of the magnetic contrast agents, and subsequent MR images may be taken at a rate of one image per minute for a desired length of time. By imaging the body in this way, a set of images may be acquired that illustrate how the magnetic contrast agent is absorbed and washed out from various portions of the patient's body. This absorption and washout information may be used to characterize various internal structures within the body and may provide additional diagnostic information.

In DCE-MRI, the acquired sequence of MR images may be combined by subtracting images from different time periods to determine how the distribution of the magnetic contrast agent has changed from image to image. However, the nature of this subtraction process is such that the resulting images may be highly susceptible to noise. This may be at least in part the result of a high-pass filter effect that is caused by the subtraction process.

The presence of this subtraction noise may be so pronounced that even portions of the MR images that include only air that surrounds the subject during image acquisition may include areas of enhancement as well as areas that appear to be small vessels and/or scars.

Accordingly, to reduce the presence of subtraction noise, one or more noise reduction techniques may be applied to the subtracted images before CAD may be performed on the image data. Examples of such noise reduction techniques include morphological operators such as those discussed in J. Serra, "Image Analysis and Mathematical Morphology", *Academic Press*, 1982, which is incorporated by reference, as well as various smoothing filters such as T. Lindinberg, "Scale-Space Theory in Computer Vision", *Kluwer Academic Publishers*, 1994, which is also incorporated by reference.

Noise reduction using morphological operators typically calculates a set of inscribed spheres at interior voxels of a region of interest and eliminates all voxels that fall outside of the spheres. Smoothing filters typically involve convolution of an image with a Gaussian kernel $e^{(-(x^2+y^2)/2\sigma)}/2\pi\sigma$ to blur the image.

While these noise reduction approaches, and similar approaches, may be effective for many purposes, when applied to the automatic detection of breast lesions from MR images, the application of these noise reduction techniques may lead to often subtle but sometimes drastic changes in the shape and/or texture of detected lesions. Because characterization of a lesion as benign or potentially malignant often involves analyzing the smoothness of the margin of the lesion, conventional techniques for reducing noise in medical images may inadvertently remove the subtle shape and/or texture information from the margin of the lesion that is important in characterizing the lesion as benign or potentially malignant.

Accordingly, existing techniques for the reduction of subtraction noise in a sequence of medical images may be ill suited for application to automatic detection of breast lesions from MR images.

SUMMARY

A method for computer assisted lesion detection in magnetic resonance (MR) images includes acquiring a set of dynamic contrast enhanced (DCE) MR images. The set of DCE-MR images is processed to produce an original subtraction image illustrating a change in voxel enhancement between the DCE-MR images. A Gaussian low-pass filter is applied to the original subtraction image. An elimination mask is created from the filtered subtraction image by removing voxels with enhancement values below a threshold value. The elimination mask is used to remove noise image data from the original subtraction image. One or more regions of suspicion are automatically detected from the noise-removed original subtraction image.

The acquired set of DCE-MR images may include a breast and the one or more regions of suspicion represent potential breast lesions. The acquired set of DCE-MR images may include a pre-contrast MR image and a sequence of post-contrast MR images acquired at predetermined intervals of time.

The processing of the set of DCE-MR images to produce an original subtraction image may include dividing the sequence of post-contrast MR images into a first sub-set representing earlier-acquired MR images and a second sub-set representing later-acquired MR images, adding positive-signed enhancement values of voxels of the MR images from the first sub-set to a combined subtraction image, adding absolute values of all enhancement values of voxels of the MR images from the second sub-set to the combined subtraction image, and using the combined subtraction image as the original subtraction image.

The Gaussian low-pass filter may have a standard deviation that is proportional to the size of the original subtraction image. The threshold value may be initially selected to be a predetermined percentage of a maximum enhancement value of a central region of a breast imaged in the DCE-MR images.

When a single structure within the elimination mask is greater than a predetermined size, the threshold value may be raised and the creation of the elimination mask may be repeated until there is no longer a single structure within the elimination mask that is greater than the predetermined size.

Automatically detecting one or more regions of suspicion from the noise-removed original subtraction image may include identifying the regions of suspicion based on an absorption and washout profile observed from the noise-removed original subtraction image.

A method for computer assisted lesion detection in magnetic resonance (MR) images includes acquiring a set of dynamic contrast enhanced (DCE) MR images including a pre-contrast MR image and a sequence of post-contrast MR images acquired at predetermined intervals of time. The sequence of post-contrast MR images is divided into a first sub-set representing earlier-acquired MR images and a second sub-set representing later-acquired MR images. Positive-signed enhancement values of voxels of the MR images from the first sub-set are added to a combined subtraction image. Absolute values of all enhancement values of voxels of the MR images from the second sub-set are added to the combined subtraction image. One or more regions of suspicion are automatically detected from the combined subtraction image.

The acquired set of DCE-MR images may include a breast and the detected regions of suspicion are potential breast lesions. The first sub-set of post-contrast MR images may be acquired in a first half of the time across which the post-contrast images are acquired and the second sub-set of post-contrast MR images may be acquired in a second half of the time across which the post-contrast images are acquired.

One or more regions of suspicion may be automatically detected from the combined subtraction image includes identifying the regions of suspicion based on an absorption and washout profile observed from the combined subtraction image.

Prior to the step of automatically detecting one or more regions of suspicion from the combined subtraction image, a Gaussian low-pass filter may be applied to the combined subtraction image, an elimination mask may be created from the filtered subtraction image by removing voxels with enhancement values below a threshold value, and the elimination mask may be used to remove noise image data from the combined subtraction image.

The Gaussian low-pass filter may have a standard deviation that is proportional to the size of the combined subtraction image. The threshold value may be initially selected to be a predetermined percentage of a maximum enhancement value of a central region of a breast imaged in the DCE-MR images. When a single structure within the elimination mask is greater than a predetermined size, the threshold value may be raised and the creation of the elimination mask repeated until there is no longer a single structure within the elimination mask that is greater than the predetermined size.

A computer system includes a processor and a program storage device readable by the computer system, embodying a program of instructions executable by the processor to perform method steps for automatically detecting breast lesions. The method includes acquiring a set of dynamic contrast enhanced (DCE) MR images of a patient's breast including a pre-contrast MR image and a sequence of post-contrast MR images acquired at predetermined intervals of time. The sequence of post-contrast MR images is divided into a first sub-set representing earlier-acquired MR images and a second sub-set representing later-acquired MR images. Positive-signed enhancement values of voxels of the MR images from the first sub-set are added to a combined subtraction image. Absolute values of all enhancement values of voxels of the MR images from the second sub-set are added to the combined subtraction image. A Gaussian low-pass filter is applied to the combined subtraction image. An elimination mask is created from the filtered subtraction image by removing voxels with enhancement values below a threshold value. The elimination mask is used to remove noise image data from the combined subtraction image. One or more potential breast lesions are automatically detected from the noise-removed combined subtraction image.

The Gaussian low-pass filter may have a standard deviation that is proportional to the size of the combined subtraction image.

The first sub-set of post-contrast MR images may be acquired in a first half of the time across which the post-contrast images are acquired and the second sub-set of post-contrast MR images may be acquired in a second half of the time across which the post-contrast images are acquired.

Automatically detecting one or more potential breast lesions from the combined subtraction image may include identifying the potential breast lesions based on an absorption and washout profile observed from the combined subtraction image.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to image a patient's breast using DCE-MRI techniques and then perform CAD to identify regions of suspicion that are more likely to be malignant breast lesions. By utilizing DCE-MRI rather than mammography, additional data pertaining to contrast absorption and washout may be used to accurately distinguish between benign and malignant breast masses.

Figure 1:
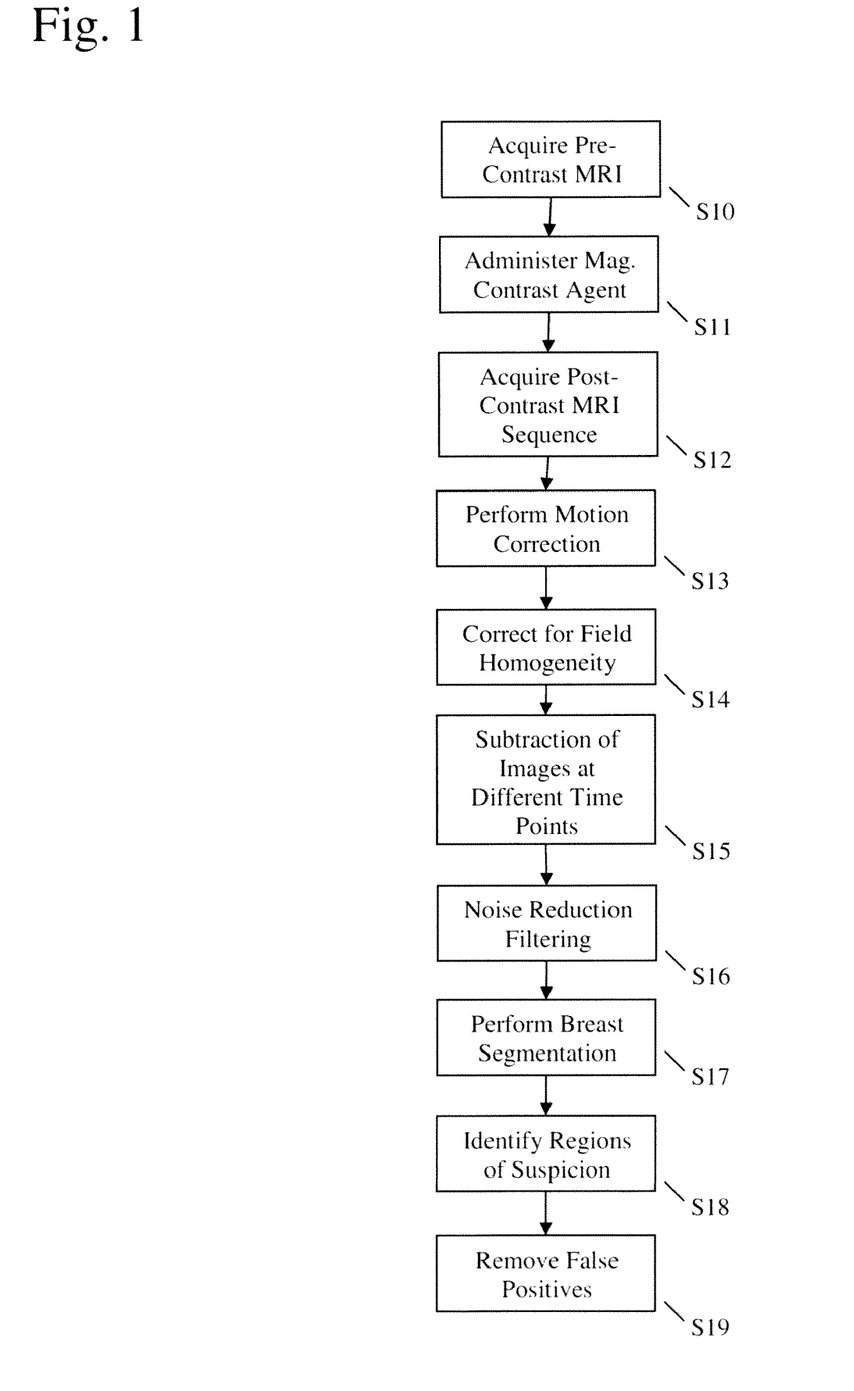
FIG. 1 is a flow chart illustrating a method for imaging a patient's breast using DCE-MRI and rendering a computer-aided diagnosis according to an exemplary embodiment of the present invention.

FIG. 1 is a flow chart illustrating a method for imaging a patient's breast using DCE-MRI and rendering a computer-aided diagnosis according to an exemplary embodiment of the present invention. First, a pre-contrast MRI is acquired (Step S10). The pre-contrast MRI may include an MR image taken of the patient before the magnetic contrast agent has been administered. The pre-contrast MRI may include one or more modalities. For example, both T1 and T2 relaxation modalities may be acquired.

Next, with the patient remaining as still as possible, the magnetic contrast agent may be administered (Step S11). The magnetic contrast agent may be a paramagnetic agent, for example, a gadolinium compound. The agent may be administered orally, intravenously, or by another means. The magnetic contrast agent may be selected for its ability to appear extremely bright when imaged in the T1 modality. By injecting the magnetic contrast agent into the patient's blood, vascular tissue may be highly visible in the MRI. Because malignant tumors tend to be highly vascularized, the use of the magnetic contrast agent may be highly effective for identifying regions suspected of being lesions.

Moreover, additional information may be gleamed by analyzing the way in which a region absorbs and washes out the magnetic contrast agent. For this reason, a sequence of post-contrast MR images may be acquired (Step S12). The sequence may be acquired at regular intervals in time, for example, a new image may be acquired every minute.

As discussed above, the patient may be instructed to remain as still as possible throughout the entire image acquisition sequence. Despite these instructions, the patient will most likely move somewhat from image to image. Accordingly, before regions of suspicion are identified (Step S18), motion correction may be performed on the images (Step S14).

At each acquisition, the image may be taken in the T1 modality that is well suited for monitoring the absorption and washout of the magnetic contrast agent.

Because MR images are acquired using a powerful magnetic field, subtle inhomogeneity in the magnetic field may have an impact on the image quality and may lead to the introduction of artifacts. Additionally, the level of enhancement in the post-contrast image sequence may be affected. Also, segmentation of the breast may be impeded by the inhomogeneity, as in segmentation, it is often assumed that a particular organ appears homogeneously. Accordingly, the effects of the inhomogeneous magnetic field may be corrected for within all of the acquired MR images (Step S14).

Next image subtraction may be performed to combine the information from the multiple MR images and provide data that is indicative of the manner in which the magnetic contrast agent is absorbed and washed out from the imaged tissues (Step S15). Subtraction may be performed by subtracting the pre-contrast MR image from each of the post-contrast MR images to obtain a set of subtraction images illustrating the relative change in enhancement at each point in time. Alternatively, exemplary embodiments of the present invention may combine the change information from each of the post-contrast MR images into a single cumulative subtractions image, for example, as described in detail below with respect to FIG. 5.

As discussed above, image subtraction may act as a high-pass filter and may introduce a potentially unacceptable level of noise into the image data.

Because of the noise introduced by subtraction (Step S15), a noise reduction filtering step may be performed (Step S16). Noise reduction filtering may seek to reduce or completely eliminate subtraction related noise and other noise that may otherwise lead to erroneous CAD results. Conventionally, noise reduction steps may lead to a blurring of the medical image data, for example, as discussed above. Accordingly, exemplary embodiments of the present invention seek to provide a method for the removal of noise such as subtraction noise without blurring the medical image data or otherwise reducing the diagnostic value of the medical image data. These novel approaches for noise reduction are discussed in detail below with respect to FIGS. 3 and 4.

The order in which motion correction (Step S13) and inhomogeneity correction (Step S14), are performed on the MR images is not critical. All that is required is that these steps be performed after image acquisitions for each given image, and prior to segmentation (Step S17). These corrective steps may be performed for each image after each image is acquired or for all images after all images have been acquired. However, it may be preferable to perform motion correction (Step S13) and magnetic field correction (Step S14) prior to performing image subtraction (Step S15) as motion and magnetic field correction may be more difficult to perform on the subtracted images. Noise reduction (Step S16) is preferably preformed after image subtraction (Step S15) to be able to remove noise caused by image subtraction.

After the corrective steps (Steps S13, S14 and S16) have been performed, breast segmentation may be performed (Step S17). Segmentation is the process of determining the contour delineating a region of interest from the remainder of the image. In making this determination, edge information and shape information may be considered.

Edge information pertains to the image intensity changes between the interior and exterior of the contour. Shape information pertains to the probable shape of the contour given the nature of the region of interest being segmented. Some techniques for segmentation such as the classical watershed transformation rely entirely on edge information. Examples of this technique may be found in L. Vincent and P. Soille, "Watersheds in digital spaces: An efficient algorithm based immersion simulations" *IEEE Trans. PAMI*, 13(6):583-589, 1991, which is incorporated by reference. Other techniques for segmentation rely entirely on shape information. For example, in M. Kass, A. Witkin, and D. Terzopoulous, "Snakes—Active contour models" *Int J Comp Vis*, 1(4): 321-331, 1987, which is incorporated by reference, a calculated internal energy of the curvature is regarded as a shape prior although its weight is hard-coded and not learned through training. In A. Tsai, A. Yezzi, W. Wells, C. Tempany, D. Tucker, A. Fan, and W. E. Grimson, "A shape-based approach to the segmentation of medical imagery using level sets" *IEEE Trans. Medical Imaging*, 22(2): 137-154, 2003, which is incorporated by reference, the shape prior of signed distance representations called eigenshapes is extracted by Principal Component Analysis (PCA). When the boundary of an object is unclear and/or noisy, the shape prior is used to obtain plausible delineation.

When searching for lesions in the breast using DCE-MRI, internal structures such as the pectoral muscles that are highly vascularized may light up with the application of the magnetic contrast agent. Thus, the pectoral muscles, and other such structures may make location of breast lesions more difficult. Accordingly, by performing accurate segmentation, vascularized structures that are not associated with the breast tissue may be removed from consideration thereby facilitating fast and accurate detection of breast lesions.

After segmentation has been performed (Step S17), the breast tissue may be isolated and regions of suspicion may be automatically identified within the breast tissue region (Step S18). A region of suspicion is a structure that has been determined to exhibit one or more properties that make it more likely to be a breast lesion than the regions of the breast tissue that are not determined to be regions of suspicion. Detection of the region of suspicion may be performed by systematically analyzing a neighborhood of voxels around each voxel of the image data to determine whether or not the voxel should be considered part of a region of suspicion. This determination may be made based on the acquired pre-contrast MR image as well as the post-contrast MR image. Such factors as size and shape may be considered.

Moreover, the absorption and washout profile of a given region may be used to determine whether the region is suspicious. This is because malignant tumors tend to show a rapid absorption followed by a rapid washout. This and other absorption and washout profiles can provide significant diagnostic information.

Breast imaging reporting and data systems (BIRADS) is a system that has been designed to classify regions of suspicion that have been manually detected using conventional breast lesion detection techniques such as mammography and breast ultrasound. Under this approach, there are six categories of suspicious regions. Category 0 indicates an incomplete assessment. If there is insufficient data to accurately characterize a region, the region may be assigned to category 0. A classification as category 0 generally implies that further imaging is necessary. Category 1 indicates normal healthy breast tissue. Category 2 indicates benign or negative. In this category, any detected masses such as cysts or fibroadenomas are determined to be benign. Category 3 indicates that a region is probably benign, but additional monitoring is recommended. Category 4 indicates a possible malignancy. In this category, there are suspicious lesions, masses or calcifications and a biopsy is recommended. Category 5 indicates that there are masses with an appearance of cancer and biopsy is necessary to complete the diagnosis. Category 6 is a malignancy that has been confirmed through biopsy.

Exemplary embodiments of the present invention may be able to characterize a given region according to the above BIRADS classifications based on the DCE-MRI data. To perform this categorization, the absorption and washout profile, as gathered from the post-contrast MRI sequence, for each given region may be compared against a predetermined understanding of absorption and washout profiles.

Figure 2:
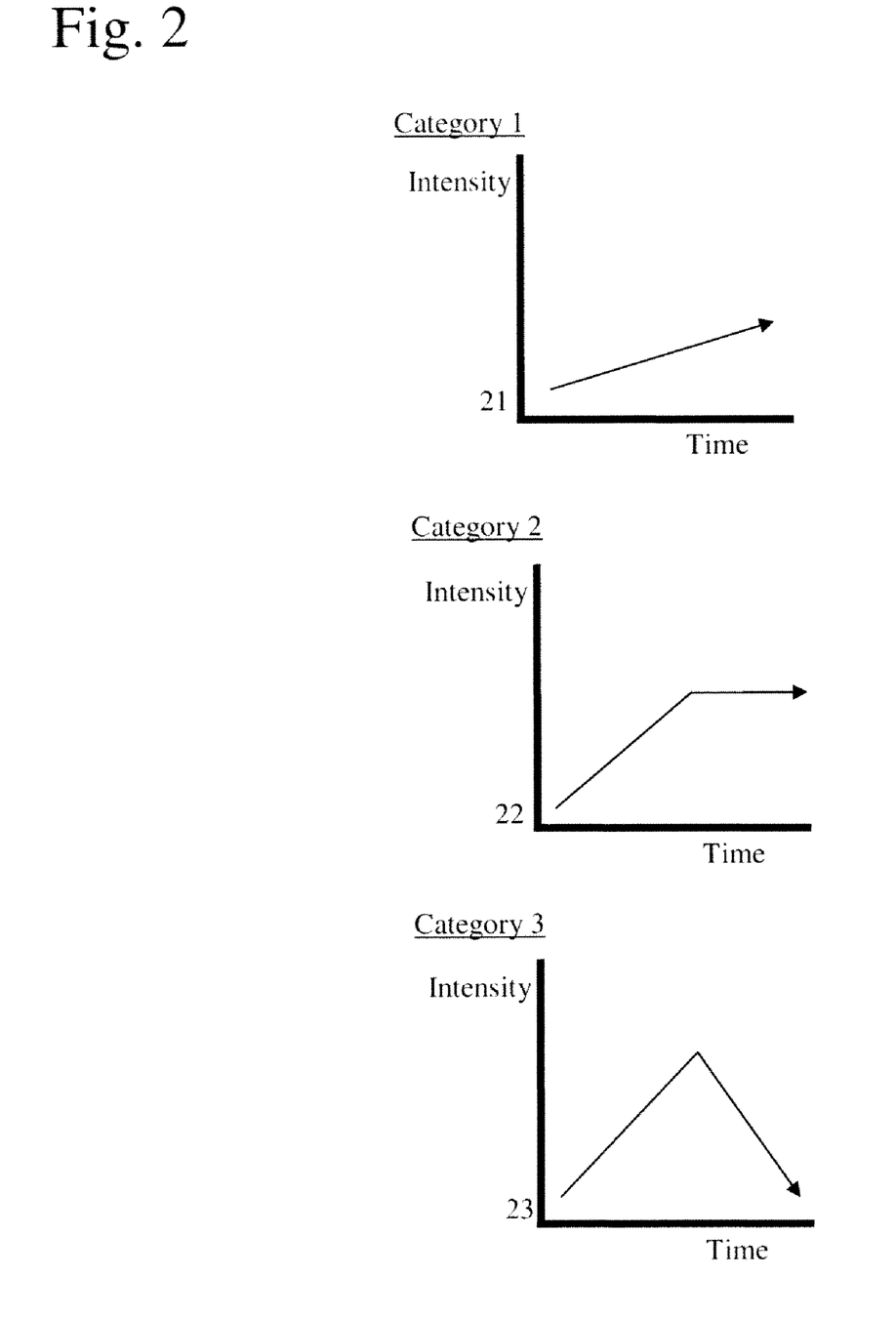
FIG. 2 is a set of graphs illustrating a correspondence between absorption and washout profiles for various BIRADS classifications according to an exemplary embodiment of the present invention.

FIG. 2 is a set of graphs illustrating a correspondence between absorption and washout profiles for various BIRADS classifications according to an exemplary embodiment of the present invention. In the first graph 21 the T1 intensity is shown to increase over time with little to no decrease during the observed period. This behavior may correspond to a gradual or moderate absorption with a slow washout. This may be characteristic of normal breast tissue and accordingly, regions exhibiting this profile may be classified as category 1.

In the next graph 22, the T1 intensity is shown to increase moderately and then substantially plateau. This behavior may correspond to a moderate to rapid absorption followed by a slow washout. This may characterize normal breast tissue or a benign mass and accordingly, regions exhibiting this profile may be classified as category 2.

In the next graph 23, the T1 intensity is shown to increase rapidly and then decrease rapidly. This behavior may correspond to a rapid absorption followed by a rapid washout. While this behavior may not establish a malignancy, it may raise enough suspicion to warrant a biopsy, accordingly, regions exhibiting this profile may be classified as category 3.

Other absorption and washout profiles may be similarly established for other BIRADS categories. In this way, DCE-MRI data may be used to characterize a given region according to the BIRADS classifications. This and potentially other criteria, such as size and shape, may thus be used to identify regions of suspicion (Step S18).

In identifying regions of suspicion (Step S18), the shape and/or texture of the margin of the regions of suspicion may be used to determine whether the region of suspicion is benign or potentially malignant. This may be achieved, for example, by analyzing the shape of the lesion to determine whether it is a spiculated lesion and/or a lesion with irregular margins or a lesion that is smooth and has regular margins. Regions of suspicion that appear to be spiculated lesions or lesions with irregular margins may be characterized as potentially malignant while regions of suspicion that appear to be smooth and have regular margins may be characterized as benign. In making such a characterization, if the image data has been blurred by the performance of conventional noise reduction approaches such as those discussed above, spiculation and/or margin irregularity may be obfuscated or removed, thereby potentially causing a malignant lesion to appear benign.

After regions of suspicion have been identified (Step S18), false positives may be removed (Step S19). As described above, artifacts such as motion compensation artifacts, artifacts cause by magnetic field inhomogeneity, and other artifacts, may lead to the inclusion of one or more false positives. Exemplary embodiments of the present invention and/or conventional approaches may be used to reduce the number of regions of suspicion that have been identified due to an artifact, and thus false positives may be removed. Removal of false positives may be performed by systematically reviewing each region of suspicion multiple times, each time for the purposes of removing a particular type of false positive. Each particular type of false positive may be removed using an approach specifically tailored to the characteristics of that form of false positive. Examples of such approaches are discussed in detail below.

After false positives have been removed (Step S19), the remaining regions of suspicion may be presented to the medical practitioner for further review and consideration. For example, the remaining regions of interest may be highlighted within a representation of the medical image data. Quantitative data such as size and shape measurements and or BIRADS classifications may be presented to the medical practitioner along with the highlighted image data. The presented data may then be used to determine a further course of testing or treatment. For example, the medical practitioner may use the presented data to order a biopsy or refer the patient to an oncologist for treatment.

Figure 3:
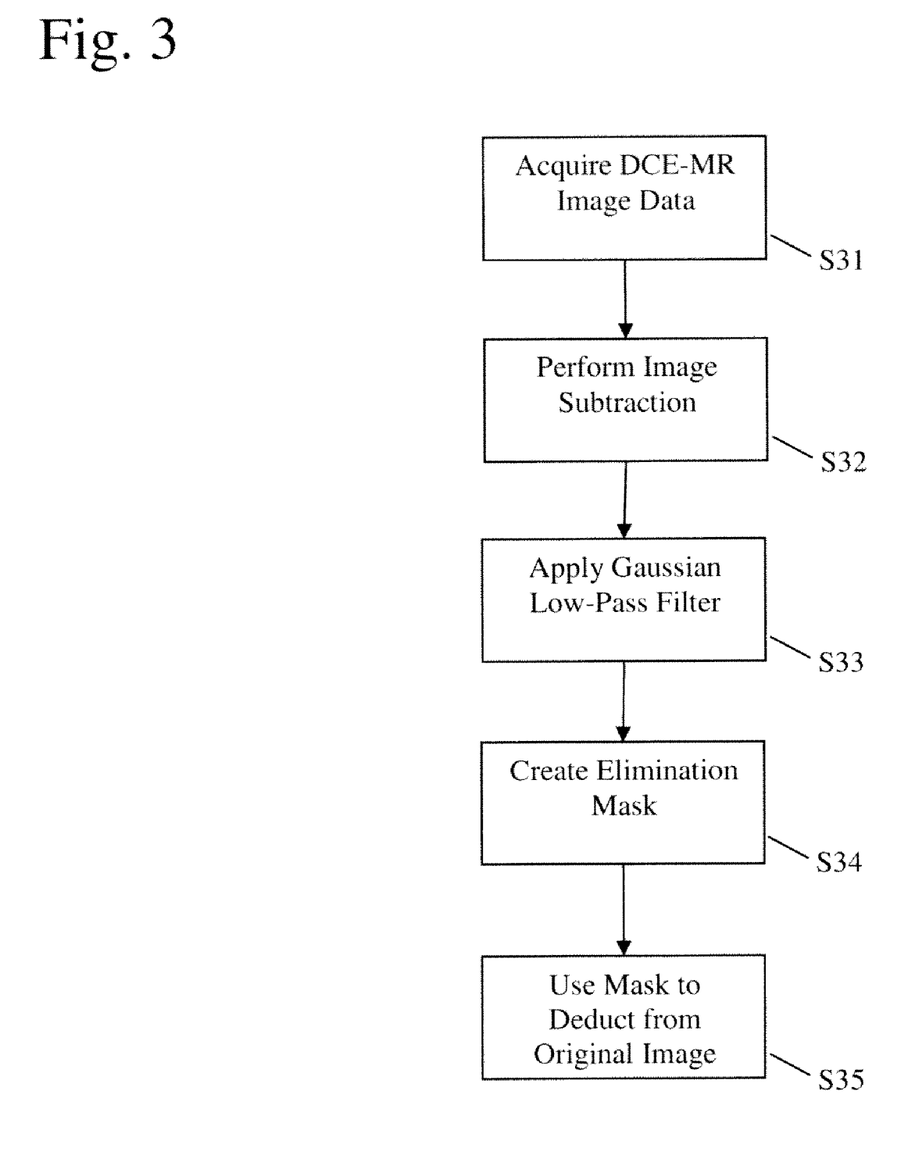
FIG. 3 is a flow chart illustrating a method for removing noise from MR images while maintaining diagnostic value according to an exemplary embodiment of the present invention.
Figure 4:
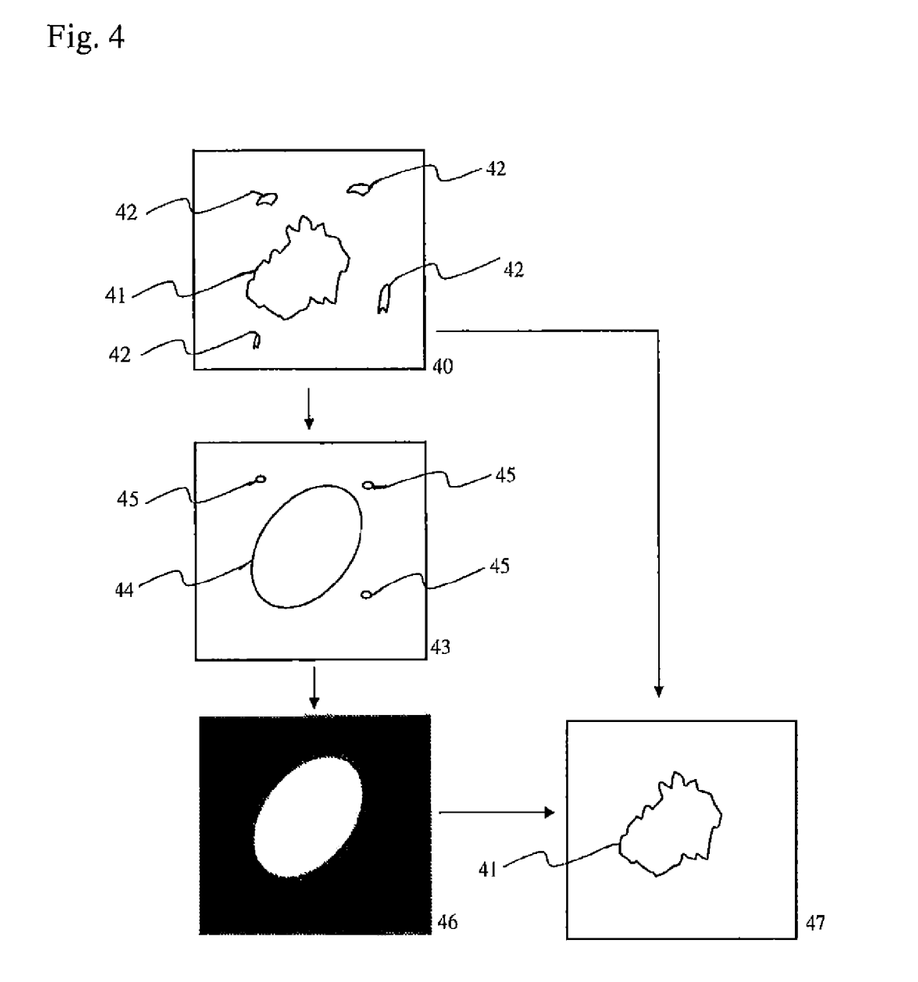
FIG. 4 is a set of drawings illustrating the performance of the method described in FIG. 3.

As described above, exemplary embodiments of the present invention seek to provide an approach for effectively removing noise caused by image subtraction or other sources without blurring the medical image data or otherwise reducing the diagnostic value of the medical image data. FIG. 3 is a flow chart illustrating a method for removing noise from MR images while maintaining diagnostic value according to an exemplary embodiment of the present invention. FIG. 4 is a set of drawings illustrating the performance of the method described in FIG. 3. A method for removing noise from MR images is described in detail below with respect to FIGS. 3 and 4.

First, the DCE-MR image data may be acquired (Step S31). Image acquisition may be as described in detail above with respect to FIG. 1, steps S10-S12. As exemplary embodiments of the present invention may be performed on existing image data or newly acquired image data, image acquisition may include retrieving stored image data from a storage medium and/or using an MR imager to acquire new image data.

After the DCE-MR image data has been acquired (Step S31), image subtraction may be performed (Step S32). As discussed above, image subtraction may be performed by subtracting the pre-contrast MR image from each of the post-contrast MR images. Accordingly, the result of image subtraction is a set of subtraction images that illustrate the flow of the magnetic contrast within the subject over time. Alternatively, exemplary embodiments of the present invention may combine the change information from each of the post-contrast MR images into a single cumulative subtractions image, for example, as described in detail below with respect to FIG. 5.

Image 40 from FIG. 4 represents a sample subtraction image. The subtraction image 40 may include a region of suspicion, for example, a lesion candidate 41, and various noise artifacts 42. The noise artifacts may be the result of the subtraction process or other sources. The noise artifacts may appear as a randomly occurring set of dark and light specs often referred to as salt and pepper noise.

A Gaussian low-pass filter may then be applied to the set of subtraction images (Step S33). The Gaussian low-pass filter may have, for example, a standard deviation that is proportional to the size of the subtraction images. Alternatively, any other form of conventional filter may be applied to the subtraction image. Image 43 represents the subtraction image after the application of the Gaussian low-pass filter. As a result of the filtering, the noise artifacts 45 may appear subdued in the filtered image 43. Accordingly, some noise artifacts 45 of the filtered image 43 may be smaller and may have a reduced level of enhancement while other noise artifacts may be entirely removed. Moreover, the lesion candidate 41, which had an irregular margin in image 40 appears in image 43 as an object with a smooth regular margin 44.

If CAD were to be performed on the filtered image 43, the filtered lesion candidate 44 may appear to be benign owing to its smooth margin even though the original lesion had an irregular margin that would have indicated a possible malignancy. However, in exemplary embodiments of the present invention, CAD is not performed on the filtered image 43. Rather, the filtered image 43 is used to create an elimination mask (Step S34). The elimination mask may be created by thresholding the filtered image such that all voxels having a level of enhancement below a predetermined level are removed. Image 46 represents an elimination mask generated according to an exemplary embodiment of the present invention.

After the elimination mask 46 has been created, the elimination mask 46 may be applied to the original subtraction image 40 (Step S35). Accordingly, the elimination mask 46 may remove all regions of the original subtraction image whose corresponding filtered voxels were below the elimination threshold, while retaining the original unfiltered characteristics for all regions whose corresponding filtered voxels were not below the elimination threshold. Thus, the noise artifacts 42 may be removed from the original subtraction image 40 to produce a final subtraction image 47 that is mostly free of noise artifacts but retains the original shape of all lesion candidates 41.

The threshold value used for thresholding the filtered image in step S34 may be predetermined or the value may be calculated based on the filtered image. According to an exemplary embodiment of the present invention, the threshold value may be selected as 30% of the maximum enhancement value of the central region of the breast. The central region of the breast may be identified, for example, by segmenting the breast surface and calculating a center of the segmented surface. The surface of the breast may be particularly simple to segment owing to the high level of contrast between the breast and the surrounding air.

By selecting the threshold value based on the central region of the breast, rather than based on an average image enhancement value, the image of the heart is excused. This may provide greater stability to the threshold value because the heart may show a high level of enhancement due to the high volume of blood that moves through the heart.

The threshold value, so selected, may also be automatically adjusted as needed. In such a case, the selected threshold value may be used as an initial threshold value and the elimination mask may be made in accordance to that initial threshold value.

The initial threshold value may in some circumstances be set too low and as a result, independent structures may appear as a single combined structure, especially where there is a fair amount of noise located in the space between the two structures. Such a situation may be identified by identifying a structure that is unusually large. Accordingly, after the threshold value has been set and the elimination mask created, if it is determined that the image includes a structure that is larger than a particular maximum size, the threshold value may be adjusted lower and the elimination mask recreated until the unexpectedly large structure is divided into multiple separate structures that are each below the particular maximum size. The particular maximum size may be set, for example, to a size slightly larger than the largest structure that the image expects to find. Accordingly, the chances of one large structure actually being multiple distinct structures is reduced and ultimately, a higher degree of noise filtering is provided without blurring the final subtraction image.

Figure 5:
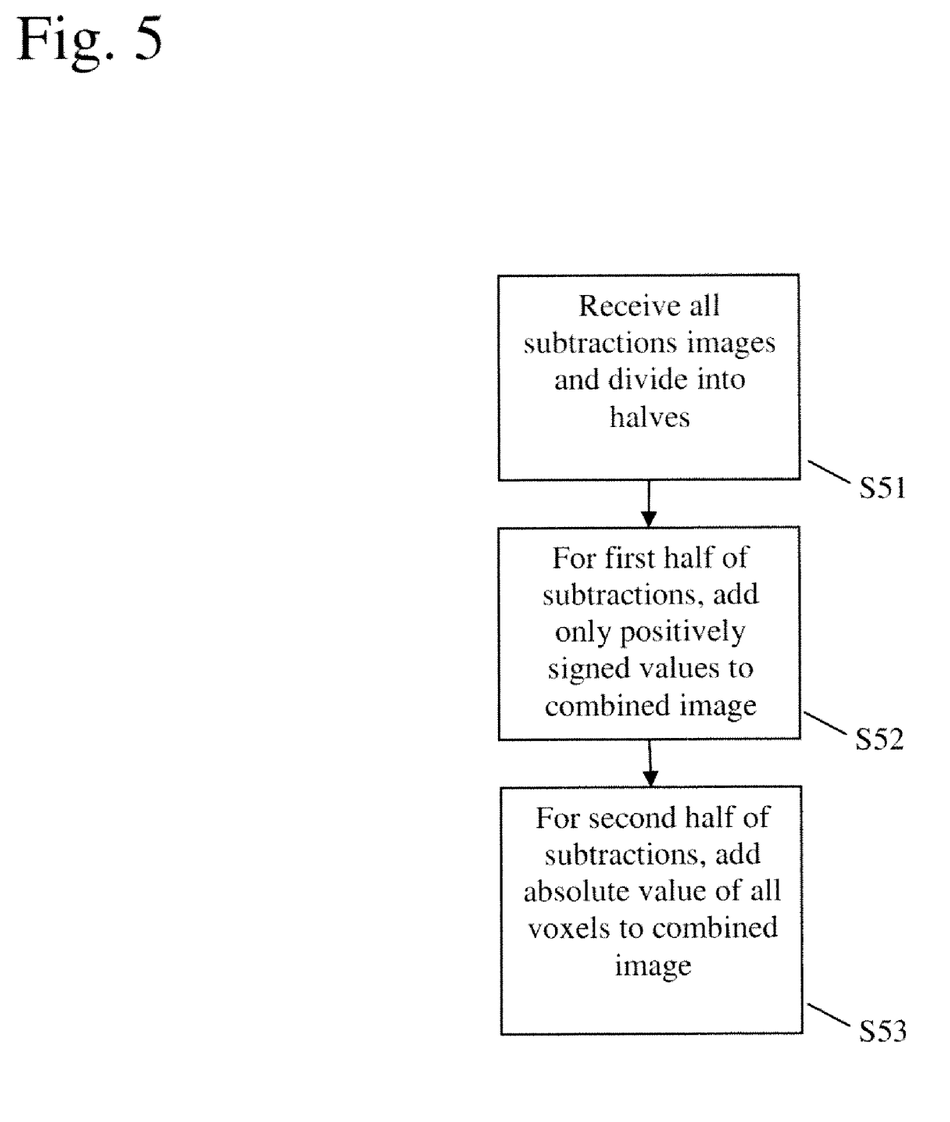
FIG. 5 is a flow chart illustrating a method for combining the change information from multiple post-contrast MR images into a single cumulative subtraction image according to an exemplary embodiment of the present invention.

As discussed above, exemplary embodiments of the present invention may combine the change information from each of the post-contrast MR images into a single cumulative subtractions image. When the multiple subtraction images are not combined, different forms of lesions may be best identifiable from different subtraction images and thus CAD must be performed separately for each image. This may be computationally intensive and time consuming. By combining the diagnostic information of multiple subtraction images into a single subtraction image, CAD need only be performed on a single image rather than multiple images. FIG. 5 is a flow chart illustrating a method for combining the change information from multiple post-contrast MR images into a single cumulative subtraction image according to an exemplary embodiment of the present invention.

In this procedure, the enhancement information form each subtraction image cannot simply be added together because areas of positive enhancement from one subtraction image may cancel out areas of negative enhancement from another subtraction image and diagnostic information may be lost.

In the subtraction images, areas of positive enhancement may represent absorption and areas of negative enhancement may represent washout. As is discussed above with respect to FIG. 2, regions of suspicion may be characterized by rapid absorption in the first half of the time across which the post-contrast images are acquired, and in the second half of time, both rapid absorption and rapid washout may be characteristic of a suspicious region. Accordingly, exemplary embodiments of the present invention may first receive all of the subtraction images and divide them into images from a first half of the time across which the post-contrast images are acquired and images from a second half of the time across which the post-contrast images are acquired (Step S51). Then, for the first half, only the positively signed enhancement values are added to the combined subtraction image (Step S52). Then, for the second half, the absolute values of all enhancement values are added to the combined subtraction image (Step S53). Accordingly, the combined subtraction image expresses the degree of first-half absorption and the degree of second half absorption and washout. Accordingly, all of the data used in identifying regions of suspicion from the full set of subtraction images may be represented as a single combined subtraction image that may be used as a single subtraction image for the CAD techniques discussed in detail above.

Figure 6:
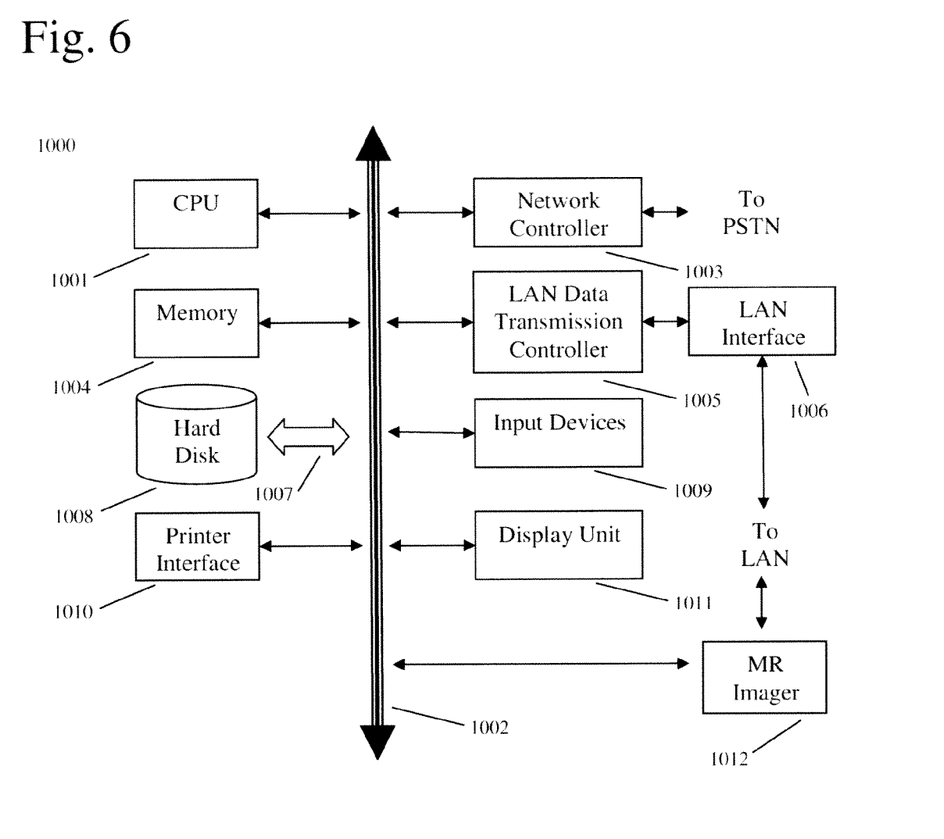
FIG. 6 shows an example of a computer system capable of implementing the method and apparatus according to embodiments of the present disclosure.

FIG. 6 shows an example of a computer system which may implement a method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system and accessible via a hard wired or wireless connection to a network, for example, a local area network, or the Internet.

The computer system referred to generally as system 1000 may include, for example, a central processing unit (CPU) 1001, random access memory (RAM) 1004, a printer interface 1010, a display unit 1011, a local area network (LAN) data transmission controller 1005, a LAN interface 1006, a network controller 1003, an internal bus 1002, and one or more input devices 1009, for example, a keyboard, mouse etc. As shown, the system 1000 may be connected to a data storage device, for example, a hard disk, 1008 via a link 1007. An MR imager 1012 may be connected to the internal bus 1002 via an external bus (not shown) or over a local area network.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A method for computer assisted lesion detection in magnetic resonance (MR) images, comprising:
    acquiring a set of dynamic contrast enhanced (DCE) MR images including a pre-contrast MR image and a sequence of post-contrast MR images acquired at predetermined intervals of time;
    dividing the sequence of post-contrast MR images into a first sub-set representing earlier-acquired MR images and a second sub-set representing later-acquired MR images;
    adding positive-signed enhancement values of voxels of the MR images from the first sub-set to a combined subtraction image;
    adding absolute values of all enhancement values of voxels of the MR images from the second sub-set to the combined subtraction image; and
    automatically detecting one or more regions of suspicion from the combined subtraction image.

2. The method of claim 1, wherein the acquired set of DCE-MR images include a breast and the detected regions of suspicion are potential breast lesions.

3. The method of claim 1, wherein the first sub-set of post-contrast MR images are acquired in a first half of the time across which the post-contrast images are acquired and the second sub-set of post-contrast MR images are acquired in a second half of the time across which the post-contrast images are acquired.

4. The method of claim 1, wherein automatically detecting one or more regions of suspicion from the combined subtraction image includes identifying the regions of suspicion based on an absorption and washout profile observed from the combined subtraction image.

5. The method of claim 1, wherein, prior to the step of automatically detecting one or more regions of suspicion from the combined subtraction image, the following additional steps are performed:
    applying a Gaussian low-pass filter to the combined subtraction image;
    creating an elimination mask from the filtered subtraction image by removing voxels with enhancement values below a threshold value; and
    using the elimination mask to remove noise image data from the combined subtraction image.

6. The method of claim 5, wherein the Gaussian low-pass filter has a standard deviation that is proportional to the size of the combined subtraction image.

7. The method of claim 6, wherein the threshold value is initially selected to be a predetermined percentage of a maximum enhancement value of a central region of a breast imaged in the DCE-MR images.

8. The method of claim 7, wherein when a single structure within the elimination mask is greater than a predetermined size, the threshold value is raised and the creation of the elimination mask repeated until there is no longer a single structure within the elimination mask that is greater than the predetermined size.

9. A computer system comprising:
    a processor; and
    a program storage device readable by the computer system, embodying a program of instructions executable by the processor to perform method steps for automatically detecting breast lesions, the method comprising:

acquiring a set of dynamic contrast enhanced (DCE) MR images of a patient's breast including a pre-contrast MR image and a sequence of post-contrast MR images acquired at predetermined intervals of time;

dividing the sequence of post-contrast MR images into a first sub-set representing earlier-acquired MR images and a second sub-set representing later-acquired MR images;

adding positive-signed enhancement values of voxels of the MR images from the first sub-set to a combined subtraction image;

adding absolute values of all enhancement values of voxels of the MR images from the second sub-set to the combined subtraction image;

applying a Gaussian low-pass filter to the combined subtraction image;

creating an elimination mask from the filtered subtraction image by removing voxels with enhancement values below a threshold value;

using the elimination mask to remove noise image data from the combined subtraction image; and automatically detecting one or more potential breast lesions from the noise-removed combined subtraction image.

10. The computer system of claim 9, wherein the Gaussian low-pass filter has a standard deviation that is proportional to the size of the combined subtraction image.

11. The computer system of claim 9, wherein the first sub-set of post-contrast MR images are acquired in a first half of the time across which the post-contrast images are acquired and the second sub-set of post-contrast MR images are acquired in a second half of the time across which the post-contrast images are acquired.

12. The computer system of claim 9, wherein automatically detecting one or more potential breast lesions from the combined subtraction image includes identifying the potential breast lesions based on an absorption and washout profile observed from the combined subtraction image.

* * * * *